United States Patent
Lee et al.

(10) Patent No.: US 7,939,790 B1
(45) Date of Patent: May 10, 2011

(54) METHOD AND APPARATUS FOR CONTROLLING THE GAIN OF AN AVALANCHE PHOTODIODE WITH FLUCTUATIONS IN TEMPERATURE

(75) Inventors: Weilong William Lee, West Covina, CA (US); Joseph C. Chon, Fremont, CA (US); Chiahung Chiu, Taipei (TW); Wayne Liao, Taipei (TW)

(73) Assignee: Wavesplitter Technologies, Inc., Fremont, CA (US)

( * ) Notice: Subject to any disclaimer, the term of this patent is extended or adjusted under 35 U.S.C. 154(b) by 681 days.

(21) Appl. No.: 12/041,539

(22) Filed: Mar. 3, 2008

Related U.S. Application Data

(60) Provisional application No. 60/904,757, filed on Mar. 2, 2007.

(51) Int. Cl.
*H03F 3/08* (2006.01)
(52) U.S. Cl. .................. 250/214 A; 250/214.1; 327/514
(58) Field of Classification Search ............... 250/208.1, 250/214 R, 214.1, 214 VT, 207, 214 VG; 257/438; 327/512–514
See application file for complete search history.

(56) References Cited

U.S. PATENT DOCUMENTS

| | | | |
|---|---|---|---|
| 6,858,829 B2 * | 2/2005 | Nishimura et al. | 250/214 R |
| 7,495,203 B2 * | 2/2009 | Kaku et al. | 250/214 A |

OTHER PUBLICATIONS

Horowitz et al., The Art of Electronics, 1980, 1st Ed, pp. 162, 163, 170, 335, and 628-631, Published by the Press Syndicate of the University of Cambridge, Printed in the United States of America.

* cited by examiner

*Primary Examiner* — Thanh X Luu
*Assistant Examiner* — Francis M Legasse, Jr.
(74) *Attorney, Agent, or Firm* — Stuart H. Mayer; Mayer & Williams PC

(57) ABSTRACT

A method and apparatus is provided for biasing an avalanche photodiodes (APD). The method includes developing a first output signal $s(v_1)$ from the APD when biased with a first bias voltage $v_1$ and developing a second output signal $s(v_2)$ from the APD when biased with a second bias voltage $v_2$, wherein $s(v)=PRZM(v)$, (P) is an light power illuminating the APD, R is a responsivity of the APD, M(v) is an APD avalanche gain and Z is a trans-impedance amplifier gain (Z). The method continues by acquiring a ratio $r=s(v_1)/s(v_2)=PRZM(v_1)/[PRZM(v_2)]=M(v_1)/M(v_2)$ and invoking a feedback control method to bias the APD using the ratio r.

15 Claims, 4 Drawing Sheets

METHOD AND APPARATUS FOR CONTROLLING THE GAIN OF AN AVALANCHE PHOTODIODE WITH FLUCTUATIONS IN TEMPERATURE

STATEMENT OF RELATED APPLICATIONS

This application claims the benefit of U.S. Provisional Patent Application Ser. No. 60/904,757, filed Mar. 2, 2007, entitled "APD Gain Control for Temperatures by Means of Bias Dither, Log Amp of Output, Lock-in Detection and Error Amp in a Feedback Loop," which is incorporated herein by reference in its entirety.

FIELD OF THE INVENTION

The present invention relates generally to avalanche photodiodes, (APDs), and more particularly to a method and apparatus for biasing an APD to control its gain.

BACKGROUND OF THE INVENTION

Photodetectors such as APDs and PIN (p-intrinsic-n) photodiodes are employed for a wide variety of purposes. For example, an optical receiver in which a photodetector serves as a receiver element is one of the key element in an optical fiber transmission network. Optical receivers, in general, function to convert optical signals into electrical signals. A typical optical receiver includes a photodetector connected to the input of an amplifier (e.g., a transimpedance amplifier). The photodetector converts the optical signal it receives into an electric current that is supplied to the amplifier. The amplifier then generates at its output a voltage or current that is proportional to the electric current. With the recent spread of broadband networks, optical receivers (and optical transmitters) have increased in speed, typically increasing in bit rate from 1.25 Gbits/s to 2.5 Gbits/s. More recently still, bit rates up to 10 Gbits/s are beginning to be widely used.

As many systems lower bit rate systems are upgraded to high bit rates, one concern is the weak sensitivity of the optical receiver. To enhance receiver sensitivity APDs are often preferred because of their superior power sensitivity in comparison to PIN photodiodes. Unfortunately, an APD can be more difficult to tune and calibrate, in part because its avalanche multiplication factor varies with ambient temperature. The following will discuss in more detail the manner in which the dependency of the gain on the bias voltage of an APD varies with temperature.

When an APD is illuminated with light, its output current (i) vs. reverse voltage (v) can be shown by the upper curve in FIG. 1. As the reverse or bias voltage increases to the punch-through voltage ($V_p$), at which point the avalanche effect induces a step-up in the output current. The output continues to increase with bias voltage until avalanche breaks down at $v=V_b$. Of course, a dark current is generally always present at the output of the APD with or without illumination. Without illumination, the dark current rises with bias in accordance with the lower curve shown in FIG. 1.

In terms of the light power (P), APD responsivity (R) and avalanche gain (M), the output current generated by the APD can be expressed as:

$$i = PRM \quad (1)$$

For $v < V_p$, there is no avalanche effect and the gain is M=1. Between $V_p$ and $V_b$, the inverse gain (1/m) is a linear function with respect to the bias (v):

$$1/M = (1 - v/V_b)/M_1 \text{ or } M = M(v) = M_1/(1 - v/V_b) \quad (2)$$

Where $M_1 = M(0)$ is a constant.

From the data in FIG. 2 for an illustrative APD, $1/M_1 = 0.9509$ and $1/(M_1 V_b) = 0.0302 [V^{-1}]$. So, in this example $M_1 = 1.05$ and $V_b = 31.5V$. When biasing the illustrative APD to measure sensitivity, the avalanche gain is usually found to be optimized for avalanche gain values around $M^* = 10$, as shown in FIG. 3 for the illustrative APD at various temperatures.

The temperature dependences for the breakdown voltage ($V_b$), the bias for M=10 and the optimal bias for a representative APD available from OKI Semiconductor are shown in FIG. 4. Defined as the "percentage change per ° C." from the breakdown voltage at 25° C. ($V_b^*$), the temperature coefficient for $V_b$, ranges from 0.10 to 0.25%/° C. as listed in Table 1, which presents data available from an OKI Semiconductor datasheet. Also listed in Table 1 are the spreads for the breakdown voltage and reponsivities (M=1 and 10).

TABLE 1

Specification of OKI's APD

| Parameter | Symbol | Test Conditions | Min. | Typ. | Max. | Unit |
|---|---|---|---|---|---|---|
| Wavelength | λ | — | 1250 | — | 1620 | nm |
| APD Breakdown Voltage | VBR | ID = 10 μA  25° C. | — | 37 | 43 | V |
|  |  | −40° C. to 85° C. | — | 37 | 50 |  |
| Temp. Coefficient of VBR** | γ | — | 0.10 | 0.15 | 0.25 | %/° C. |
| APD Responsivity | RAPD | λ = 1.55 μm, M = 1 | 0.8 | 0.9 | — | A/W |
|  |  | λ = 1.31 μm, M = 1 | 0.75 | 0.85 | — |  |
|  |  | λ = 1.62 μm, M = 1 | — | 0.75 | — |  |
| Responsivity | R | RL = 100 Ω, M = 10 | 16 | 26 | 38 | kV/W |
|  |  | Pin = −30 dBm, Differential |  |  |  |  |
| Bandwidth | BW | f-3 dB, RL = 50 Ω, M = 10 | 1700 | 2000 | — | MHz |
| Low frequency cutoff | fc_low | RL = 50 Ω | — | 3 | — | kHz |
| Sensitivity | Prmin | 2.488 Gbps,  25° C. | — | −35 | −33.5 | dBm |
|  |  | NRZ,  Rext* = 10 dB |  |  |  |  |
|  |  | BER = $10^{-10}$, −40° C. to 85° C. | — | −33 | −31.5 |  |
|  |  | $PRBS2^{23} - 1$, Rext* = 10 dB |  |  |  |  |
|  |  | M = Mopt. |  |  |  |  |
| Overload | Prmax | 2.488 Gbps, NRZ, | −7 | −3 | — | dBm |
|  |  | BER = $10^{-10}$, $PRBS2^{23} - 1$, |  |  |  |  |
|  |  | M = Mopt. |  |  |  |  |
| Supply Current | $I_{cc}$ | Pin = 0 mW | — | 44 | 60 | mA |
| Recommended TIA Supply Voltage | $V_{cc}$ | — | 3.0 | 3.3 | 3.6 | V |

In practice, due to variations of the breakdown voltage and the optimal value of the bias voltage, each APD chip or lot has to be tested for the optimal bias vs. temperature. The test data are programmed as a look-up table in the actual APD circuit, which also includes a temperature sensor. With a temperature sensor, an optimal bias is selected from the table to bias the APD for each discrete temperature range. This temperature characterization process can be costly to implement for most APD applications.

SUMMARY OF THE INVENTION

In accordance with the present invention, a method and apparatus is provided for biasing an avalanche photodiodes (APD). The method includes developing a first output signal $s(v_1)$ from the APD when biased with a first bias voltage $v_1$ and developing a second output signal $s(v_2)$ from the APD when biased with a second bias voltage $v_2$, wherein $s(v)=PRZM(v)$, (P) is an light power illuminating the APD, R is a responsivity of the APD, M(v) is an APD avalanche gain and Z is a trans-impedance amplifier gain (Z). The method continues by acquiring a ratio $r=s(v_1)/s(v_2)=PRZM(v_1)/[PRZM(v_2)]=M(v_1)/M(v_2)$ and invoking a feedback control method to bias the APD using the ratio r.

In accordance with one aspect of the invention, $v1=v$ and $v2=v-\delta$, where $\delta \ll v$, $V_b$ is an avalanche break-down voltage of the APD, $M(v)=M_1/(1-v/V_b)$ and $r=1+\delta M(v)/(M_1 V_b)$, where $M_1$ is a constant.

In accordance with another aspect of the invention, $\delta$ is an oscillatory parameter and the step of invoking the feedback control method includes recovering $\delta M(v)/(M_1 V_b)$ using signal processing techniques.

In accordance with another aspect of the invention, $\delta$ is sinusoidal.

In accordance with another aspect of the invention, $\delta$ is a digital clock signal.

In accordance with another aspect of the invention, $r-1=\text{Log}[s(v+\delta)]-\text{Log}[s(v)]$ and the step of invoking the feedback control method includes biasing the APD with a voltage $v+\delta$ so that an output $s(v+\delta)$ is generated by the APD and filtering out a term $\text{Log}[s(v)]$ to retain a factor $\delta M/(M_1 V_b)$.

In accordance with another aspect of the invention, the dither signal is an oscillatory signal.

In accordance with another aspect of the invention, a method is provided for controlling the gain of an APD. The method includes applying a bias voltage to an APD, wherein the bias voltage includes a dither signal, and converting an output current generated by the APD into an output voltage. The output voltage is logarithmically amplified and multiplied by the dither signal to generate a multiplier output voltage. The multiplier output voltage is filtered to remove high frequency components therefrom. The bias voltage applied to the APD is adjusted to reduce an error signal defined by a difference between the filtered multiplier output voltage and a reference voltage.

In accordance with another aspect of the invention, the output signal is filtered to remove its dither component prior to being directed to a post amplifier for subsequent processing.

In accordance with another aspect of the invention, an arrangement is provided for biasing an APD. The arrangement includes a bias source generating a bias voltage for reverse biasing the APD and a dither source for generating a dither signal that is AC coupled with the bias voltage. A transimpedance amplifier is provided for amplifying an output signal generated by the APD to produce an output voltage.

A logarithmic amplifier is also provided for receiving at least a portion of the output voltage from the transimpedance amplifier. The arrangement also includes a lock-in multiplier having first and second inputs for receiving an output from the logarithmic amplifier and the dither source, respectively, and an output for providing a multiplier output voltage. A low pass filter arrangement is provided for removing high frequency components from the multiplier output voltage. An error amplifier having first and second inputs is provided for receiving a filtered multiplier output voltage from the low pass filter arrangement and a reference voltage, respectively. The bias source has a feedback input for receiving an error signal from the error amplifier to adjust the bias voltage generated by the bias source.

DETAILED DESCRIPTION OF THE INVENTION

The present invention provides a method and apparatus for controlling the bias voltage applied to an APD to achieve a desired or optimal gain. In one embodiment, the method is based on a feedback loop to automatically adjust for temperature changes. The loop taps off a small portion of the APD output, compares it with a reference value to generate an error signal, and then amplifies the error signal to establish the appropriate bias. For an APD having an output current in accordance with equation (1), i=PRM, the light power is an external variable and the responsivity is a parameter that varies with each individual APD chip. The gain (M), however, is an internal variable that can be isolated controlled in the feedback loop. Therefore, a technique is needed to eliminate P and R from equation (1). This can be achieved as follows.

First, the current (i) in equation (1) can be expressed as a function of the bias (v) by substitution of equation (2).

$$i=i(v)=PRM_1/(1-v/V_b)$$

Next, P and R can be canceled out by taking a ratio of $i(v+\delta)/i(v)$, that is by taking a ratio of the output current at two different bias voltages that differ from one another by a small differential $\delta$. $\delta$ should generally be much smaller than v in order to apply the differential approximation. In addition, for reasons explained below, $\delta$ should also be periodic so that dither de-modulation can be performed. In terms of equations (2) and (3):

$$i(v+\delta)/i(v)=[i(v)+\delta di(v)/dv]/i(v)=1+\delta M/(M_1 V_b) \qquad (4)$$

Clearly, P and R have been eliminated from equation (4). Next, a value of 1 is subtracted from $i(v+\delta)/i(v)$ to isolate the term $\delta M/(M_1 V_b)$. However, the algebraic operations of ratio and subtraction give rise to:

$$i(v+\delta)/i(v)-1=\delta d\,\text{Log}[i(v)]/dv=\text{Log}[i(v+\delta)]-\text{Log}[i(v)] \qquad (5)$$

Based on equation 5, it can be seen that biasing the APD with a bias voltage $v+\delta$ is equivalent to performing a logarithmic operation on the output i(v+δ), and then filtering out the term Log[i(v)] to retain δM/(M₁V_b).

$$\text{Log}[i(v+\delta)]-\text{Log}[i(v)]=\delta M/(M_1 V_b) \quad (6)$$

There is a great advantage in using the equivalent method to bias the APD because the logarithmic and filter operations can be easily implanted in a circuit using readily available IC's.

Figure 1:
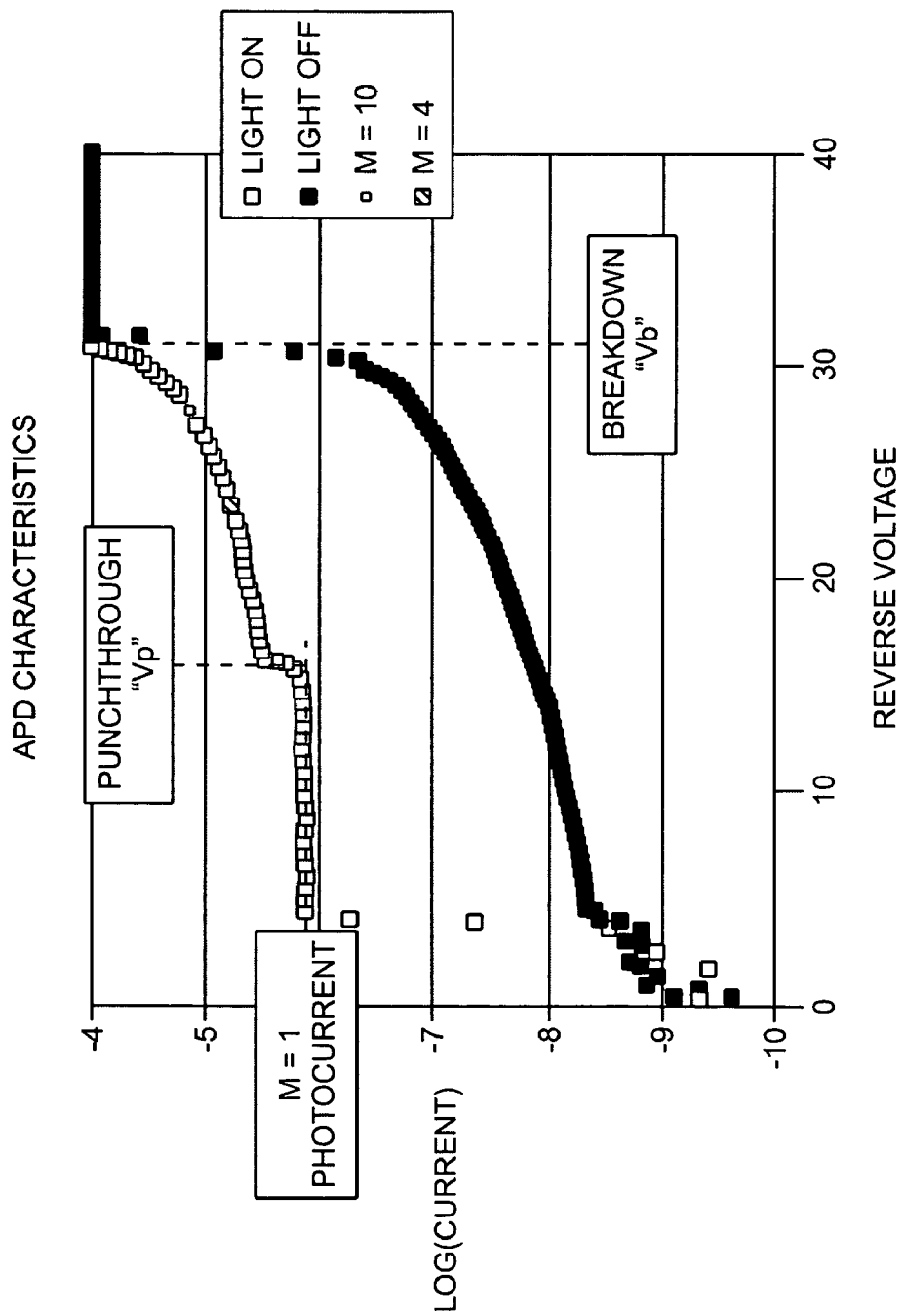
FIG. 1 is a graph of the APD output current vs. reverse voltage for a typical APD when light is incident on the APD (upper curve) and without light incident on the APD (lower curve)
Figure 2:
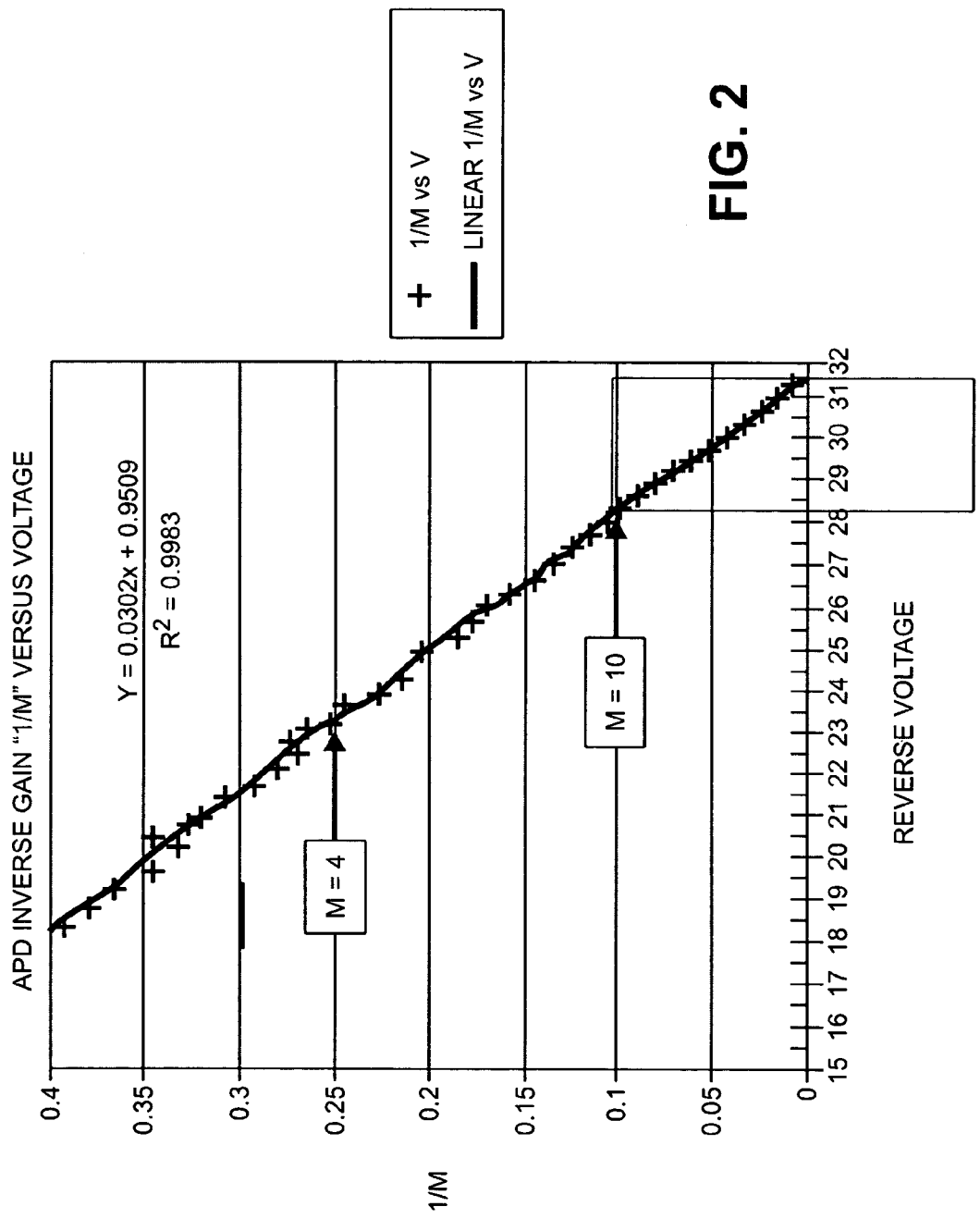
FIG. 2 is a graph showing the linear relationship between the inverse gain and the reverse voltage of an APD.
Figure 3:
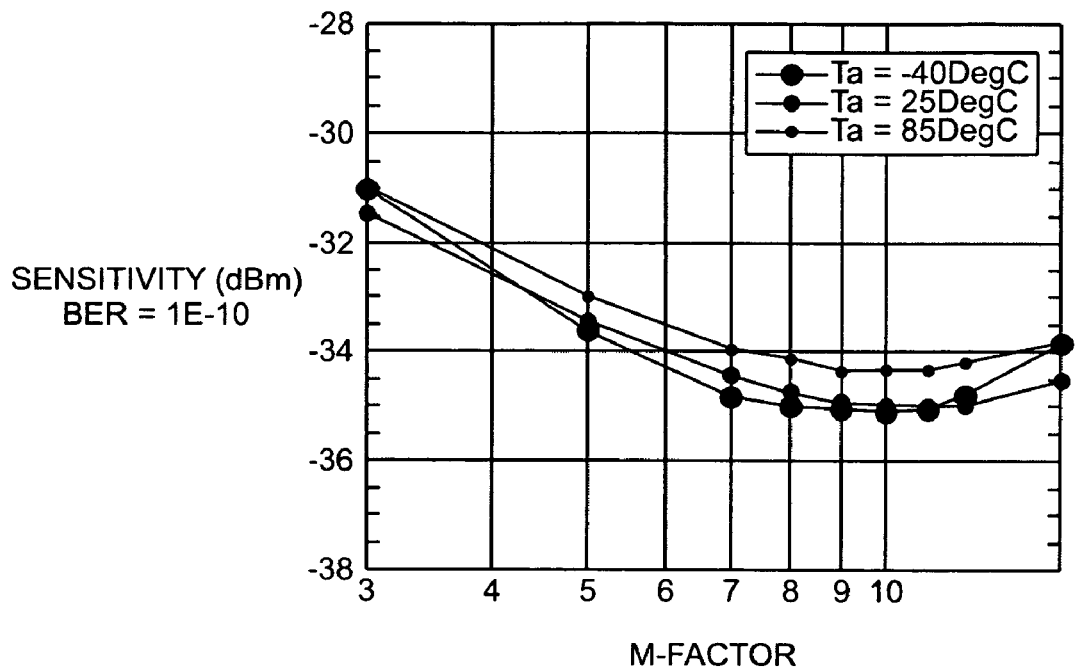
FIG. 3 is a graph showing the APD sensitivity measurement vs. gain factor for 3 different temperatures.
Figure 4:
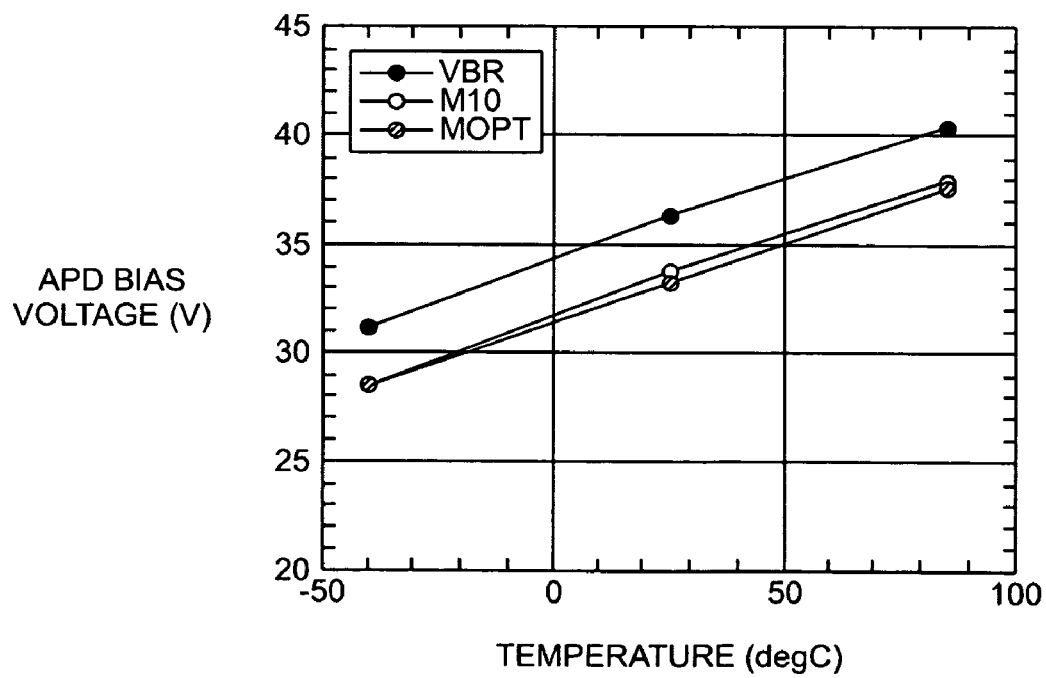
FIG. 4 is a graph showing the temperature dependence of the APD bias voltage.

It should be noted that if the quantity in equation (6) is controlled by a temperature independent reference for M=M*=10 at 25° C., then the values of M will only change slightly with temperature because of V_b. As temperature varies, δ is a fixed factor, M₁ remains unchanged and V_b changes by a maximum coefficient of about 0.25%/° C., as taken from Table 1. For the extreme case of −40° C., V_b will decrease by a factor of 1−0.25%*(25+40)=0.84. To keep the quantity of equation (6) constant, M will change by the same factor from M=10 to M=10*0.84=8.4. This is still a very good gain factor for achieving a sufficient value for the APD sensitivity, as indicated in FIG. 3. Even at a temperature of 85° C., the gain factor remains at an adequate value since M only increases to M=10*(1+0.25%*60)=11.5.

Figure 5:
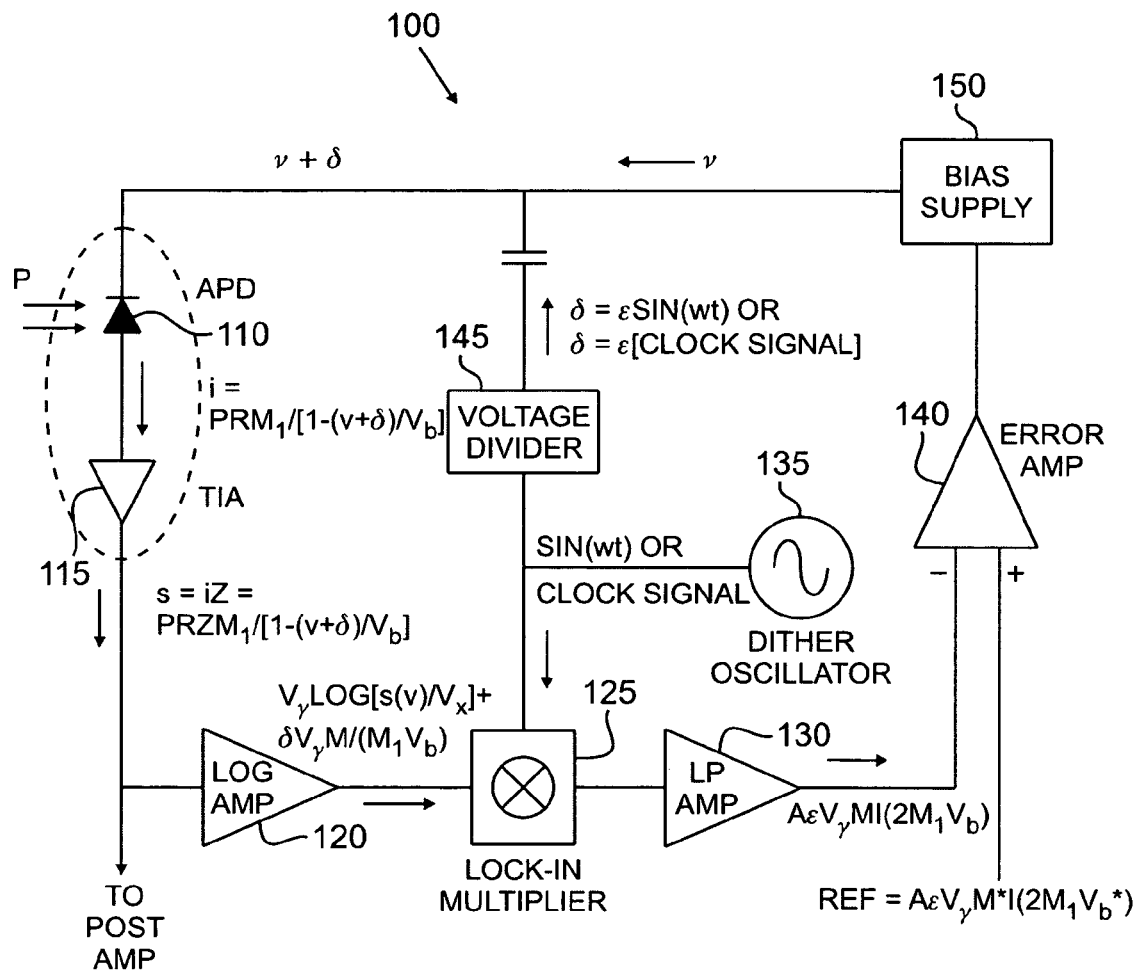
FIG. 5 is a block diagram of one embodiment of an APD feedback control circuit.

FIG. 5 shows a schematic block diagram of one example of circuit 100 that may be employed to implement the method described above for biasing an APD. The circuit 100 includes an APD 110 that is biased by a voltage v from a bias supply 150, along with a dither signal δ. The dither signal, which is generated by dither oscillator 135, is reduced to a small dither signal as δ=δ(wt) by a voltage divider 145, and then AC coupled onto the APD bias (v). The dither signal can be a sinusoidal or clock signal.

By applying a bias voltage of v+δ instead of δ, the APD current of equation (3) becomes:

$$i=i(v+\delta)=PRM_1/[1-(v+\delta)/V_b] \quad$$

The output of the APD 110 is received by a trans-impedance amplifier (TIA) 115, which is typically packaged with the APD inside a TO-can. The TIA 115 converts the relatively small current generated by the APD 110 into a larger voltage signal (s). For a trans-impedance of Z, the APD current is converted into a voltage signal (s) as:

$$s=s(v+\delta)=PRZM_1/[1-(v+\delta)/V_b] \quad (7)$$

In a conventional arrangement, the signal (s) from the TIA 115 goes directly to a Post Amp for subsequent processing. In this case a portion of the signal (s) is tapped off for use in the feedback loop, where it is received by a logarithmic amplifier 120. The logarithmic amplifier, which in one embodiment may be a logarithmic amplifier that is commercially available from Analog Devices as Model No. AD8310, converts the signal as V_γ Log[s(v+δ)/V_x], where V_γ is the slope voltage and V_x the intercept voltage. The Taylor expansions for the signal are:

$$V_\gamma \text{Log}[s(v+\delta)/V_x]=V_\gamma \text{Log}[s(v)/V_x]+\delta V_\gamma d\text{Log}[s(v)/V_x]/dv+O[\delta^2]$$

The first term $V_\gamma \text{Log}[s(v)/V_x]$ has no frequency component of w/(2π). The second term can be expressed, similar to equation (6), as δV_γM/(M₁V_b), which depends on the w/(2π) frequency by the dither factor of δ=δ(wt). So, omitting higher order terms since δ<<v:

$$V_\gamma \text{Log}[s(v+\delta)/V_x]=V_\gamma \text{Log}[s(v)/V_x]+\delta V_\gamma M/(M_1 V_b) \quad (8)$$

Equation 8 shows the significance of using both a bias dither and logarithmic amplification. In particular, the dither separates the signal from the TIA 115 into a term without δ and a term linear in δ. The logarithmic amplifier, by taking the derivative of "d Log[s(v)/V_x]/dv", cancels out the factor PRZ/V_x and brings about the APD gain (M), which is the parameter to be controlled.

The output from the logarithmic amplifier 120 is directed to a first input of lock-in multiplier 125 and the dither signal is directed to a second input of the lock-in amplifier 125. In this way the signal of equation (8) will be shifted up and down in frequency by w/(2π). For the case of δ=ϵ Sin(wt), the second term of equation (8) will shift up to a 2wt(=wt+wt) part and down to a DC(=wt−wt) part as:

$$[\epsilon \text{ Sin(wt)}V_\gamma M/(M_1 V_b)]\text{Sin(wt)}=[1-\text{Cos(2wt)}]\epsilon V_\gamma M/(2M_1 V_b) \quad (9)$$

The same DC term ϵV_γM/(2M₁V_b) can be derived for the clock signal. In some cases a phase difference between the two inputs to the lock-in multiplier 125 may be adjusted to maximize the DC term. Since the first term of equation (8) has no w/(2π) frequency, the multiplier 125 will yield out ϵV_γM/(2M₁V_b) as the only DC component.

The output from the lock-in amplifier is directed to a low-pass amplifier filter 130, which filters out most of the non-DC terms and provides a gain for the DC term so as to be comparable to the reference value (Ref). The low-pass filter should preferably have a very low cut-off frequency. However, in one embodiment the cut-off frequency should at least be 10 times more than the frequency that is inversely proportional to the thermal time scale of the APD application. The gain (A) of the low-pass amplifier filter 130 may be set to a value such that a band-gap reference IC can be used for the reference value of AϵV_γM*/(2M₁V_b*).

The signals AϵV_γM*/(2M₁V_b*) and AϵV_γM/(2M₁V_b) are received by the inputs of an error amplifier 140. The output from the error amplifier 140 is directed to the feedback input of the bias supply 150, thus completing the APD gain control loop. The function of the error amplifier 140 is to amplify any appreciable "difference" between AϵV_γM*/(2M₁V_b*) and AϵV_γM/(2M₁V_b) so that the feedback input will induce a correction to the bias (v) supplied to the APD 110 by the bias supply 150. The correction will change AϵV_γM/(2M₁V_b) through the feedback loop many times. Each time the "difference" gets smaller until it is negligible. The loop time is determined by the low pass filter on the low-pass amplifier filter 130, as discussed in terms of the thermal time scale.

In one particular embodiment that is relatively low in cost, the dither oscillator 135, lock-in multiplier 125, low-pass amplifier filter 130 and the error amplifier 140 can each be implemented using just one Op Amp selected from an inexpensive Quad Op Amp. Various examples of a relaxation oscillator circuit can be used as a guide in designing the dither oscillator with an Op Amp. Such examples are shown, for example, in Horowitz and Hill: The Art of Electronics, 1st Ed, Pages 162, 163, 170, 335 and 628-631. Because many TIAs have a 30 kHz cutoff frequency, the dither oscillator 135 could be designed with a higher frequency in the range of about 100~300 kHz. Those of ordinary skill in the art will recognize that the designs for the low-pass amplifier filter 130 and the error amplifier 140 are straight forward and that such designs are readily available from numerous references.

Before going to the Post Amp, the output signal from the TIA 115 may first go through a low pass or notch filter to filter out its dither component. From equation (7) for the TIA output signal:

$$s=s(v+\delta)=s(v)+\delta ds(v)/dv$$

After the filter, the signal s(v) going to the Post Amp will be the same as if the APD is biased without any dither. With the filter in place, the gain control loop will have no effect on the APD's normal function.

The invention claimed is:

1. A method for biasing an APD, comprising:
   developing a first output signal $s(v_1)$ from the APD when biased with a first bias voltage $v_1$ and developing a second output signal $s(v_2)$ from the APD when biased with a second bias voltage $v_2$, wherein $s(v)=PRZM(v)$, (P) is an light power illuminating the APD, R is a responsivity of the APD, M(v) is an APD avalanche gain and Z is a trans-impedance amplifier gain (Z);
   acquiring a ratio $r=s(v_1)/s(v_2)=PRZM(v_1)/[PRZM(v_2)]=M(v_1)/M(v_2)$; and
   invoking a feedback control method to bias the APD using the ratio r.

2. The method of claim 1 wherein $v1=v$ and $v2=v-\delta$, where $\delta \ll v$, $V_b$ is an avalanche break-down voltage of the APD, $M(v)=M_1/(1-v/V_b)$ and $r=1+\delta M(v)/(M_1 V_b)$, where $M_1$ is a constant.

3. The method of claim 2 wherein $\delta$ is an oscillatory parameter, whereby the step of invoicing the feedback control method includes recovering $\delta M(v)/(M_1 V_b)$ using signal processing techniques.

4. The method of claim 3 wherein $\delta$ is sinusoidal.

5. The method of claim 3 wherein $\delta$ is a digital clock signal.

6. The method of claim 2 wherein $r-1=\text{Log}[s(v+\delta)]-\text{Log}[s(v)]$ and the step of invoking the feedback control method includes biasing the APD with a voltage $v+\delta$ so that an output $s(v+\delta)$ is generated by the APD and filtering out a term $\text{Log}[s(v)]$ to retain a factor $\delta M/(M_1 V_b)$.

7. The method of claim 1 wherein the feedback control method that is invoked comprises:
   applying a bias voltage to the APD, wherein the bias voltage includes a dither signal;
   converting an output current generated by the APD into an output voltage;
   logarithmically amplifying the output voltage;
   multiplying the output voltage by the dither signal to generate a multiplier output voltage;
   filtering the multiplier output voltage to remove high frequency components therefrom; and
   adjusting the bias voltage applied to the APD to reduce an error signal defined by a difference between the filtered multiplier output voltage and a reference voltage.

8. The method of claim 7 wherein the dither signal is an oscillatory signal.

9. A method of controlling gain of an APD, comprising:
   applying a bias voltage to an APD, wherein the bias voltage includes a dither signal;
   converting an output current generated by the APD into an output voltage;
   logarithmically amplifying the output voltage;
   multiplying the output voltage by the dither signal to generate a multiplier output voltage;
   filtering the multiplier output voltage to remove high frequency components therefrom; and
   adjusting the bias voltage applied to the APD to reduce an error signal defined by a difference between the filtered multiplier output voltage and a reference voltage.

10. The method of claim 9 wherein the dither signal is an oscillatory signal.

11. The method of claim 9 wherein the dither signal is a sinusoidal signal.

12. The method of claim 9 wherein the dither signal is a digital clock signal.

13. The method of claim 9 further comprising filtering the output signal to remove its dither component prior to being directed to a post amplifier for subsequent processing.

14. An arrangement for biasing an APD, comprising:
   a bias source generating a bias voltage for reverse biasing the APD;
   a dither source for generating a dither signal that is AC coupled with the bias voltage;
   a transimpedance amplifier for amplifying an output signal generated by the APD to produce an output voltage;
   a logarithmic amplifier for receiving at least a portion of the output voltage from the transimpedance amplifier;
   a lock-in multiplier having first and second inputs for receiving an output from the logarithmic amplifier and the dither source, respectively, and an output for providing a multiplier output voltage;
   a low pass filter arrangement for removing high frequency components from the multiplier output voltage; and
   an error amplifier having first and second inputs for receiving a filtered multiplier output voltage from the low pass filter arrangement and a reference voltage, respectively, wherein the bias source has a feedback input for receiving an error signal from the error amplifier to adjust the bias voltage generated by the bias source.

15. The arrangement of claim 14 wherein the dither source is a dither oscillator for generating an oscillatory dither signal.

* * * * *